United States Patent
Park et al.

(10) Patent No.: US 9,087,977 B2
(45) Date of Patent: Jul. 21, 2015

(54) SEMICONDUCTOR DEVICE HAVING PINNED LAYER WITH ENHANCED THERMAL ENDURANCE

(71) Applicants: Jeong-Heon Park, Hwaseong-si (KR); Ki-Woong Kim, Yongin-si (KR); Hee-Ju Shin, Yongin-si (KR); Joon-Myoung Lee, Suwon-si (KR); Woo-Jin Kim, Yongin-si (KR); Jae-Hoon Kim, Seoul (KR); Se-Chung Oh, Yongin-si (KR); Yun-Jae Lee, Seoul (KR)

(72) Inventors: Jeong-Heon Park, Hwaseong-si (KR); Ki-Woong Kim, Yongin-si (KR); Hee-Ju Shin, Yongin-si (KR); Joon-Myoung Lee, Suwon-si (KR); Woo-Jin Kim, Yongin-si (KR); Jae-Hoon Kim, Seoul (KR); Se-Chung Oh, Yongin-si (KR); Yun-Jae Lee, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/254,871

(22) Filed: Apr. 16, 2014

(65) Prior Publication Data
US 2015/0048464 A1 Feb. 19, 2015

(30) Foreign Application Priority Data
Aug. 13, 2013 (KR) .................. 10-2013-0096009

(51) Int. Cl.
| | |
|---|---|
| *H01L 43/02* | (2006.01) |
| *H01L 43/08* | (2006.01) |
| *H01F 10/32* | (2006.01) |
| *G11C 11/16* | (2006.01) |

(52) U.S. Cl.
CPC .............. *H01L 43/08* (2013.01); *G11C 11/161* (2013.01); *H01F 10/32* (2013.01)

(58) Field of Classification Search
CPC ........ H01L 43/08; H01F 10/32; G11C 11/161
See application file for complete search history.

(56) References Cited

U.S. PATENT DOCUMENTS

| | | | |
|---|---|---|---|
| 6,870,711 B1 | 3/2005 | Zhao et al. | |
| 8,188,558 B2 | 5/2012 | Wang et al. | |
| 8,389,301 B2 | 3/2013 | Ranjan et al. | |
| 2008/0070063 A1* | 3/2008 | Ibusuki et al. | 428/811 |
| 2011/0133298 A1* | 6/2011 | Chen et al. | 257/421 |
| 2013/0032910 A1 | 2/2013 | Jung et al. | |

\* cited by examiner

*Primary Examiner* — Long Pham
(74) *Attorney, Agent, or Firm* — Renaissance IP Law Group LLP

(57) ABSTRACT

A semiconductor device is provided having a free layer and a pinned layer spaced apart from each other. A tunnel barrier layer is formed between the free layer and the pinned layer. The pinned layer may include a lower pinned layer, and an upper pinned layer spaced apart from the lower pinned layer. A spacer may be formed between the lower pinned layer and the upper pinned layer. A non-magnetic junction layer may be disposed adjacent to the spacer or between layers in the upper or lower pinned layer.

20 Claims, 15 Drawing Sheets

SEMICONDUCTOR DEVICE HAVING PINNED LAYER WITH ENHANCED THERMAL ENDURANCE

CROSS-REFERENCE TO RELATED APPLICATION

This application claims priority under 35 U.S.C. §119 to Korean Patent Application No. 10-2013-0096009 filed on Aug. 13, 2013, the disclosure of which is hereby incorporated by reference in its entirety.

BACKGROUND

1. Field

Embodiments of the inventive concepts relate to a magnetoresistive random access memory (MRAM) having a pinned layer with enhanced thermal endurance.

2. Description of Related Art

In a semiconductor device such as a magnetoresistive random access memory (MRAM), various methods of improving magnetoresistance ratio are being studied.

SUMMARY

Embodiments of the inventive concepts provide a semiconductor device having a magnetic tunnel junction which improves a magnetoresistance ratio.

The technical objectives of the inventive concepts are not limited to those specifically identified herein and other objectives may become apparent to those of ordinary skill in the art based on the following descriptions.

In accordance with an aspect of the inventive concepts, a semiconductor device may include a free layer, a pinned layer facing the free layer, and a tunnel barrier layer disposed between the free layer and the pinned layer. The pinned layer may include a lower pinned layer, an upper pinned layer spaced apart from the lower pinned layer, a spacer disposed between the lower pinned layer and the upper pinned layer, and a non-magnetic junction layer adjacent to the spacer.

In some embodiments, the non-magnetic junction layer may be a non-magnetic metal junction layer.

In other example embodiments, the non-magnetic junction layer may include a material having a lower diffusion coefficient than the spacer.

In still other embodiments, the non-magnetic junction layer may include a material having an interlayer exchange coupling strength $|J_{ex}|$ greater than 0.1 erg/cm$^2$.

In still other embodiments, the non-magnetic junction layer may include Ta, Rh, Ir, Cr, V, Re, Mo, W, Nb, or a combination thereof.

In still other embodiments, the thickness of the non-magnetic junction layer may be smaller than that of the spacer.

In still other embodiments, the thickness of the spacer may be 1 nm or less, and the thickness of the non-magnetic junction layer may be 0.5 nm or less.

In still other embodiments, the non-magnetic junction layer may be formed between the spacer and the upper pinned layer, between the spacer and the lower pinned layer, or between the spacer and the upper pinned layer and between the spacer and the lower pinned layer.

In still other embodiments, the upper pinned layer may include a first upper pinned layer, and a second upper pinned layer disposed on the first upper pinned layer. The non-magnetic junction layer may include a first non-magnetic junction layer disposed between the first upper pinned layer and the second upper pinned layer.

In still other embodiments, the second pinned layer may be formed between the tunnel barrier layer and the first upper pinned layer. The second upper pinned layer may be in contact with the tunnel barrier layer. The second upper pinned layer may be thicker than the first upper pinned layer.

In still other embodiments, the non-magnetic junction layer may further include a second non-magnetic junction layer disposed between the spacer and the first upper pinned layer.

In still other embodiments, the non-magnetic junction layer may further include a third non-magnetic junction layer disposed between the spacer and the lower pinned layer.

In still other embodiments, the non-magnetic junction layer may further include a second non-magnetic junction layer disposed between the spacer and the first upper pinned layer, and a third non-magnetic junction layer disposed between the spacer and the lower pinned layer.

In still other embodiments, the lower pinned layer may include a first lower pinned layer, and a second lower pinned layer disposed on the first lower pinned layer. The non-magnetic junction layer may be formed between the first lower pinned layer and the second lower pinned layer.

In accordance with another aspect of the inventive concepts, a semiconductor device may include a switching device connected to a wordline, a data storage element connected to the switching device, and a bitline connected to the data storage element. The data storage element may include a free layer, a synthetic anti-ferromagnetic (SAF) pinned layer spaced apart from the free layer, and a tunnel barrier layer disposed between the free layer and the SAF pinned layer. The SAF pinned layer may include a lower pinned layer, an upper pinned layer spaced apart from the lower pinned layer, a spacer disposed between the lower pinned layer and the upper pinned layer, and a non-magnetic metal junction layer adjacent to the spacer. The non-magnetic metal junction layer may be a material layer having a lower diffusion coefficient than the spacer. The non-magnetic metal junction layer may include a material having an interlayer exchange coupling strength $|J_{ex}|$ greater than 0.1 erg/cm$^2$.

Details of other embodiments are included in the following detailed description and accompanying drawings.

BRIEF DESCRIPTION OF THE DRAWINGS

The foregoing and other features and advantages of the inventive concepts will be apparent from the following description of preferred embodiments made in conjunction with the accompanying drawings. In the accompanying drawings, like reference numerals denote the like elements throughout the different views. It should be noted that the drawings are not necessarily to scale, and variations in shapes and sizes of the elements is to be expected as a result, for instance, of manufacturing processes. The emphasis of the drawings is instead placed upon illustrating the principles of the inventive concepts to those of skill in the art. In the drawings.

DETAILED DESCRIPTION OF THE EMBODIMENTS

Figure 1:
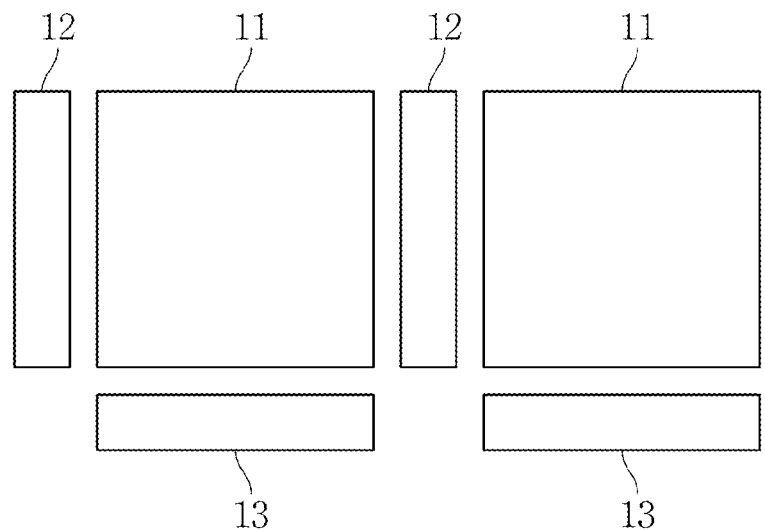
FIG. 1 is a schematic block diagram of a portion of a semiconductor device in accordance with embodiments of the inventive concepts.

Various embodiments will now be described more fully with reference to the accompanying drawings, which illustrate only some of the potential embodiments of the inventive concepts. These inventive concepts may be embodied in other forms and should therefore not be construed as being limited to the particular embodiments set forth herein. Rather, these embodiments are presented to provide a thorough and complete disclosure and to fully convey the inventive concepts to those skilled in the art.

In the drawings, the sizes and relative sizes of layers and regions may be exaggerated for clarity. It will be understood that when an element or layer is referred to as being "on," "connected to" or "coupled to" another element or layer, it can be directly on, connected to or coupled to the other element or layer, or other intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms "first," "second," "A," "B," etc. may be used herein in reference to elements of the inventive concepts, such elements should not be construed as limited by these terms. For example, a first element could be termed a second element, and a second element could be termed a first element, without departing from the scope of the present inventive concepts. Herein, the term "and/or" includes any and all combinations of one or more listed elements.

Terms such as "beneath," "below," "lower," "above," "upper" and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon the overall device orientation. In addition, the device may reoriented in other ways (rotated 90 degrees or at any other desired orientations) and the descriptors used herein should be interpreted accordingly.

The terminology used herein to describe embodiments of the inventive concepts is not intended to limit the scope of the inventive concepts. The articles "a" and "an" are singular in that they have a single referent, however the use of the singular form in the present document should not preclude the presence of more than one referent. In other words, elements referred to in the singular may include one or more of those elements, unless the context clearly indicates otherwise. It will be further understood that the terms "comprises," "comprising," "includes," and/or "including," when used herein, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art, and not in an idealized or overly formal sense, unless expressly so defined herein.

FIG. 1 is a schematic block diagram of a portion of a semiconductor device in accordance with embodiments of the inventive concepts.

Referring to FIG. 1, a semiconductor device constructed in accordance with embodiments of the inventive concepts may include a plurality of cell array blocks 11, a plurality of first decoders 12, and a plurality of second decoders 13. Ones of the first decoders 12 and the cell array blocks 11 may be alternately arranged. A corresponding one of the second decoders 13 may be disposed at a side of a respective cell array block 11. The first decoders 12 and the second decoders 13 may be electrically connected to the cell array blocks 11.

Figure 2:
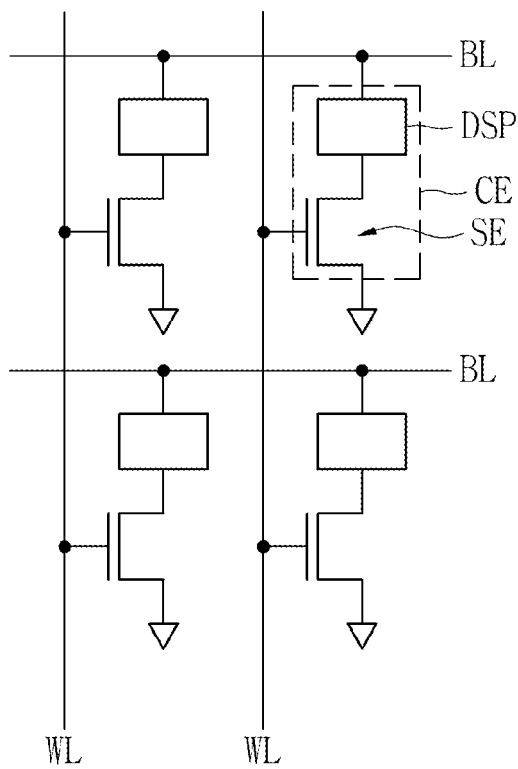
FIG. 2 is an equivalent schematic circuit diagram showing a part of a cell array block of a semiconductor device in accordance with embodiments of the inventive concepts.

FIG. 2 is a schematic circuit diagram of an equivalent circuit showing a part of a cell array block of a semiconductor device in accordance with embodiments of the inventive concepts.

Referring to FIGS. 1 and 2, each of the cell array blocks 11 may include a plurality of bitlines BL, a plurality of wordlines WL, and a plurality of memory cells CE. Each of the memory cells CE may include a data storage element DSP and a switching device SE. The wordlines WL may be arranged in parallel to each other. The bitlines BL may also be arranged in parallel to each other. The bitlines BL may cross the wordlines WL. The memory cells CE may be formed at intersections of the bitlines BL and the wordlines WL.

Each of the memory cells CE may include a magnetoresistive random access memory (MRAM). Each memory cell CE may include a magnetic tunnel junction. For example, the memory cell CE may include a spin transfer torque magnetoresistive random access memory (STT-MRAM). The data storage element DSP may be a perpendicular magnetization magnetic device using interface perpendicular anisotropy. In other embodiments, the data storage element DSP may be a horizontal magnetization magnetic device. The switching device SE may be a transistor. A drain of the switching device SE may be connected to the data storage element DSP, and a gate electrode of the switching device SE may be connected to one selected from the wordlines WL. One end of the data storage element DSP may be connected to a selected one of the bitlines BL. The switching device SE may function to control electric signals flowing through a selected one of the bitlines BL via the data storage element DSP.

FIGS. 3 to 22 are somewhat schematic cross-sectional views of semiconductor devices in accordance with embodiments of the inventive concepts.

Figure 3:
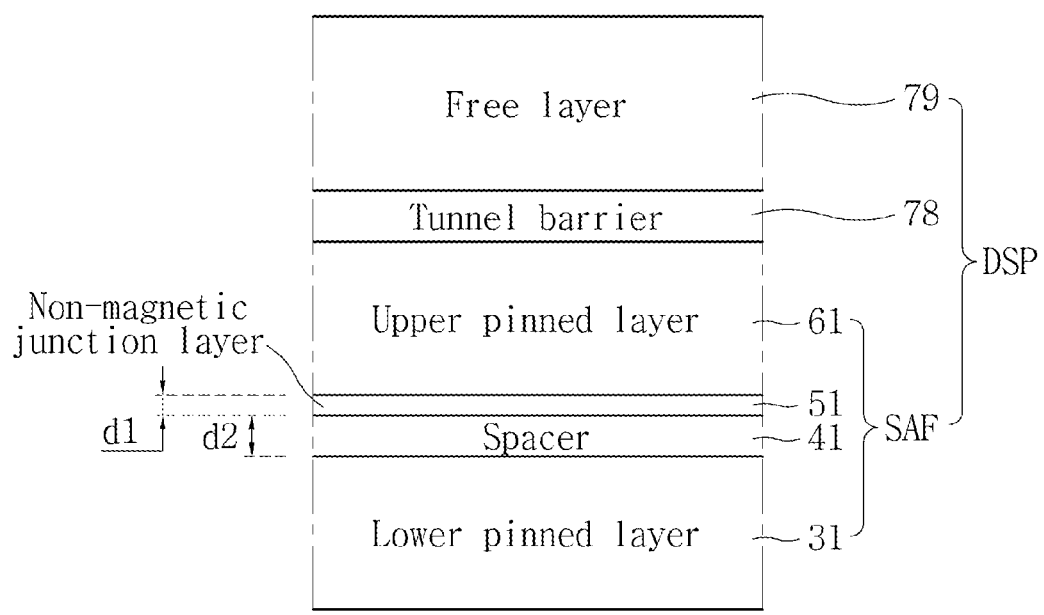
FIGS. 3 to 22 are somewhat schematic cross-sectional views of various semiconductor devices constructed in accordance with embodiments of the inventive concepts.

Referring to FIG. 3, a data storage element DSP may include a lower pinned layer 31, a spacer 41, a first non-magnetic junction layer 51, an upper pinned layer 61, a tunnel barrier layer 78, and a free layer 79. The lower pinned layer 31, the spacer 41, the first non-magnetic junction layer 51, and the upper pinned layer 61 may constitute a synthetic anti-ferromagnetic (SAF) pinned layer. The SAF pinned layer may be referred to as a "reference layer," and the free layer 79 may be referred to as a "storage layer."

The lower pinned layer 31 may be electrically connected to the drain of the switching device (SE in FIG. 2). The lower pinned layer 31 may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof. For example, the lower pinned layer 31 may be a CoFeB layer. The spacer 41 may include Ru, Ir, Cr, Rh, or a combination thereof. For example, the spacer 41 may be a Ru layer. The upper pinned layer 61 may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof. For example, the upper pinned layer 61 may be a CoFeB layer.

The spacer 41 may be formed on the lower pinned layer 31. The spacer 41 may be in contact with the lower pinned layer 31. The spacer 41 may be formed between the lower pinned layer 31 and the upper pinned layer 61. The first non-magnetic junction layer 51 may be formed on the spacer 41. The first non-magnetic junction layer 51 may be formed between the spacer 41 and the upper pinned layer 61. The spacer 41 may be in contact with the lower pinned layer 31 and the first non-magnetic junction layer 51. The upper pinned layer 61 may be formed on the first non-magnetic junction layer 51. The first non-magnetic junction layer 51 may be in contact with the spacer 41 and the upper pinned layer 61.

The first non-magnetic junction layer 51 may have a first thickness d1. The spacer 41 may have a second thickness d2. The second thickness d2 of the spacer 41 may be smaller than a thickness of either of the lower pinned layer 31 or the upper pinned layer 61. The first thickness d1 of the first non-magnetic junction layer 51 may be smaller than the second thickness d2 of the spacer 41. The first thickness d1 of the first non-magnetic junction layer 51 may be 0.5 nm or less. The second thickness d2 of the spacer 41 may be 1 nm or less. The first non-magnetic junction layer 51 may be referred to as a "dusting layer."

The first non-magnetic junction layer 51 may include a different material from the spacer 41. The first non-magnetic junction layer 51 may be a non-magnetic metal junction layer. The first non-magnetic junction layer 51 may include a material having a lower diffusion coefficient than the spacer 41. For example, the first non-magnetic junction layer 51 may include a material having a lower diffusion coefficient than the spacer 41 at a temperature higher than 300° C. The first non-magnetic junction layer 51 may include a material having high interlayer exchange coupling strength. The interlayer exchange coupling strength may be represented by |Jex| (the absolute value of Jex). The interlayer exchange coupling strength may have a negative value for anti-parallel coupling, and a positive value for parallel coupling. The first non-magnetic junction layer 51 may include a material having |Jex| greater than 0.1 erg/cm$^2$ (|Jex|>0.1 erg/cm$^2$). For example, the first non-magnetic junction layer 51 may include a material having—Jex greater than 0.1 erg/cm$^2$. The first non-magnetic junction layer 51 may include a material having Jex smaller than −0.1 erg/cm$^2$. The first non-magnetic junction layer 51 may include a material having a negative Jex value, such as −0.1 erg/cm$^2$, −0.2 erg/cm$^2$, −0.3 erg/cm$^2$, −0.4 erg/cm$^2$, or −0.5 erg/cm$^2$.

The first non-magnetic junction layer 51 may include Ta, Rh, Ir, Cr, V, Re, Mo, W, Nb, or a combination thereof. The first non-magnetic junction layer 51 may be a mixed layer one or more materials selected from the group consisting of Ta, Rh, Ir, Cr, V, Re, Mo, W, Nb, and combinations thereof, and the spacer 41. The first non-magnetic junction layer 51 may be a mixed layer of one or more materials selected from the group consisting of Ta, Rh, Ir, Cr, V, Re, Mo, W, Nb, and combinations thereof, and the upper pinned layer 61. The first non-magnetic junction layer 51 may be a mixed layer of one or more materials selected from the group consisting of Ta, Rh, Ir, Cr, V, Re, Mo, W, Nb, and combinations thereof, and the lower pinned layer 31. The first non-magnetic junction layer 51 may be formed using a physical vapor deposition (PVD) process, a chemical vapor deposition (CVD) process, an atomic layer deposition (ALD) process, or a combination thereof.

The tunnel bather layer 78 may be formed on the upper pinned layer 61. The tunnel barrier layer 78 may be in contact with the upper pinned layer 61. The tunnel barrier layer 78 may include a metal oxide, such as MgO or AlO. For example, the tunnel bather layer 78 may be an MgO layer. The free layer 79 may be formed on the tunnel barrier layer 78. The free layer 79 may be in contact with the tunnel barrier layer 78. The free layer 79 may be connected to a selected one of the bitlines (BL in FIG. 2). The free layer 79 may include CoFeB, CoFeNi, CoFeCr, CoFeBSi, CoFeBCr, CoFeBAl, CoFeBV, FeB, FeNi, FeTa, Ta, W, Mo, Nb, or a combination thereof. The free layer 79 may include a single layer or a multilayer.

According to embodiments of the inventive concepts, a stray field applied to the free layer 79 may be minimized due to a configuration of the SAF pinned layer. The first non-magnetic junction layer 51 may function as a barrier that prevents diffusion of materials included in the spacer 41 to other layers or interface areas nearby. A magnetic device having a high magnetoresistance ratio may thereby be implemented. The first non-magnetic junction layer 51 may include a material having high interlayer exchange coupling strength. The thickness of the first non-magnetic junction layer 51 may be smaller than that of the spacer 41. Loss of strength of interlayer exchange coupling among the lower pinned layer 31, the spacer 41, and the upper pinned layer 61 may be reduced or minimized.

The data storage element DSP may be in a high resistance state when a direction of a spin of the free layer 79 is opposite to a direction of a spin of the SAF pinned layer. The data storage element DSP may be in a low resistance state when a direction of a spin of the free layer 79 is the same as a direction of a spin of the SAF pinned layer. The magnetoresistance ratio of the data storage element DSP may be represented by the equation: ((high resistance−low resistance)/low resistance)×100(%).

For use as a memory device, it is advantageous to increase the magnetoresistance ratio of the data storage element DSP. An annealing process may be performed in order to increase the magnetoresistance ratio of the data storage element DSP. The annealing process may be performed, for example, for 10 minutes to 24 hours at a temperature ranging between approximately 250° C. to about 400° C. The annealing process may be determined by a crystallization temperature and crystallization time of the data storage element DSP. For example, the annealing process may be performed for about 30 minutes at a temperature of about 350° C.

Experimentation has determined that a high magnetoresistance ratio of 200% or more may be implemented using the data storage element DSP including the first non-magnetic junction layer 51 according to principles of the inventive concepts.

Figure 4:
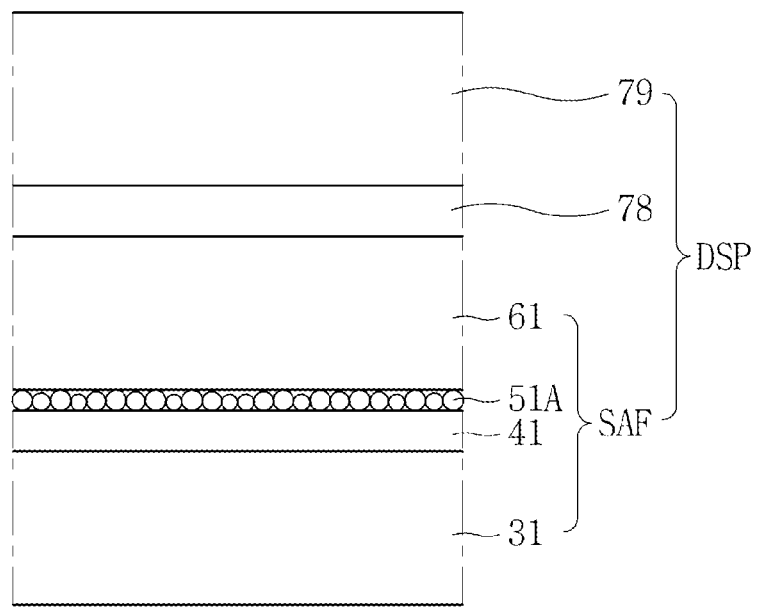

Referring to FIG. 4, a data storage element DSP may include a lower pinned layer 31, a spacer 41, a first non-magnetic junction layer 51A, an upper pinned layer 61, a tunnel barrier layer 78, and a free layer 79. The lower pinned layer 31, the spacer 41, the first non-magnetic junction layer 51A, and the upper pinned layer 61 may constitute an SAF pinned layer. The thickness of the first non-magnetic junction layer 51A may be 0.5 nm or less. The first non-magnetic junction layer 51A may be a single atomic layer. The first non-magnetic junction layer 51A may have a non-uniform thickness. The first non-magnetic junction layer 51A may include Ta, Rh, Ir, Cr, V, Re, Mo, W, Nb, or a combination thereof.

Figure 5:
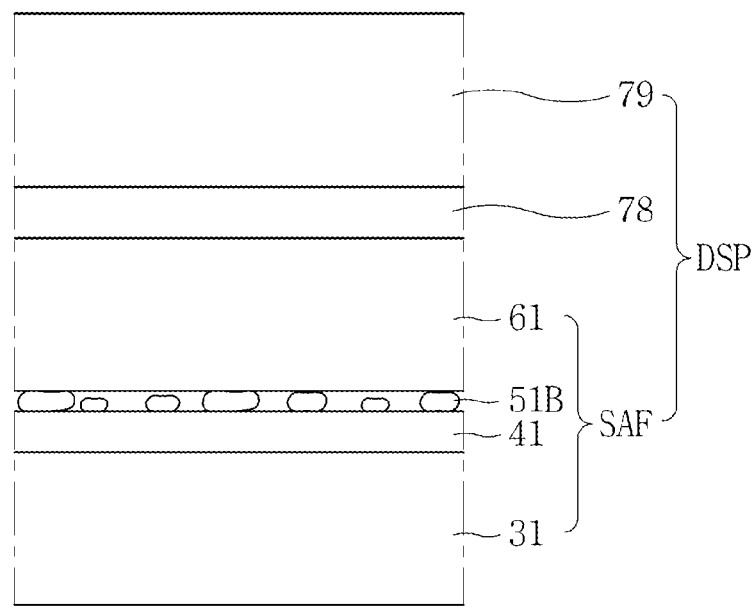

Referring to FIG. 5, a data storage element DSP may include a lower pinned layer 31, a spacer 41, a first non-magnetic junction layer 51B, an upper pinned layer 61, a tunnel barrier layer 78, and a free layer 79. The lower pinned layer 31, the spacer 41, the first non-magnetic junction layer 51B, and the upper pinned layer 61 may constitute an SAF pinned layer. The thickness of the first non-magnetic junction layer 51B may be 0.5 nm or less. The first non-magnetic junction layer 51B may have a discrete configuration. The first non-magnetic junction layer 51B may include Ta, Rh, Ir, Cr, V, Re, Mo, W, Nb, or a combination thereof.

In other embodiments, the first non-magnetic junction layer 51B may be retained between the spacer 41 and the upper pinned layer 61, and the upper pinned layer 61 may pass through the first non-magnetic junction layer 51B to be in contact with the spacer 41.

Figure 6:
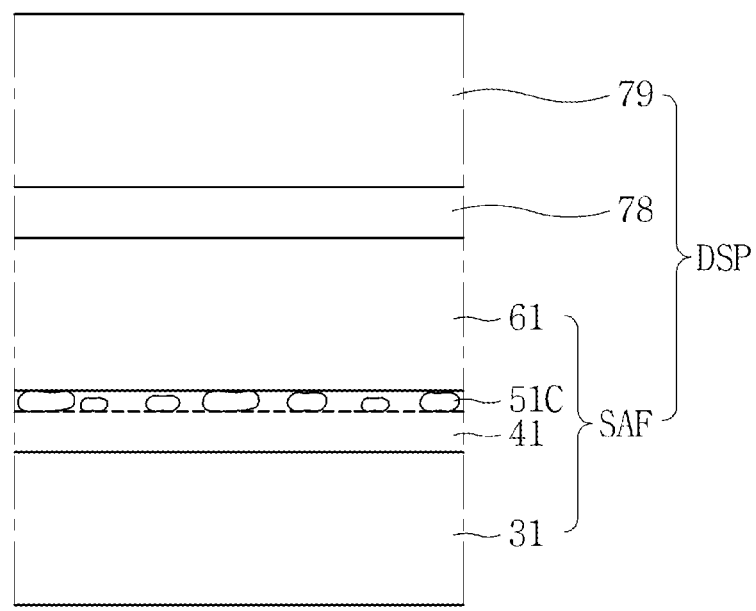

Referring to FIG. 6, a data storage element DSP may include a lower pinned layer 31, a spacer 41, a first non-magnetic junction layer 51C, an upper pinned layer 61, a tunnel barrier layer 78, and a free layer 79. The lower pinned layer 31, the spacer 41, the first non-magnetic junction layer 51C, and the upper pinned layer 61 may configure an SAF pinned layer. The thickness of the first non-magnetic junction layer 51C may be 0.5 nm or less.

The first non-magnetic junction layer 51C may be a mixed layer of one or more materials selected from the group consisting of Ta, Rh, Ir, Cr, V, Re, Mo, W, Nb, and combinations thereof, and the spacer 41. For example, the first non-magnetic junction layer 51C may be formed of one or more materials selected from the group consisting of Ta, Rh, Ir, Cr, V, Re, Mo, W, Nb, and combinations thereof, and a material used to form the spacer 41, using a co-sputtering technique. In other embodiments, the first non-magnetic junction layer 51C may be formed by alternately depositing one or more materials selected from the group consisting of Ta, Rh, Ir, Cr, V, Re, Mo, W, Nb, and combinations thereof, and a material used to form the spacer 41. The first non-magnetic junction layer 51C may be formed with the spacer 41 using an in-situ process.

Figure 7:
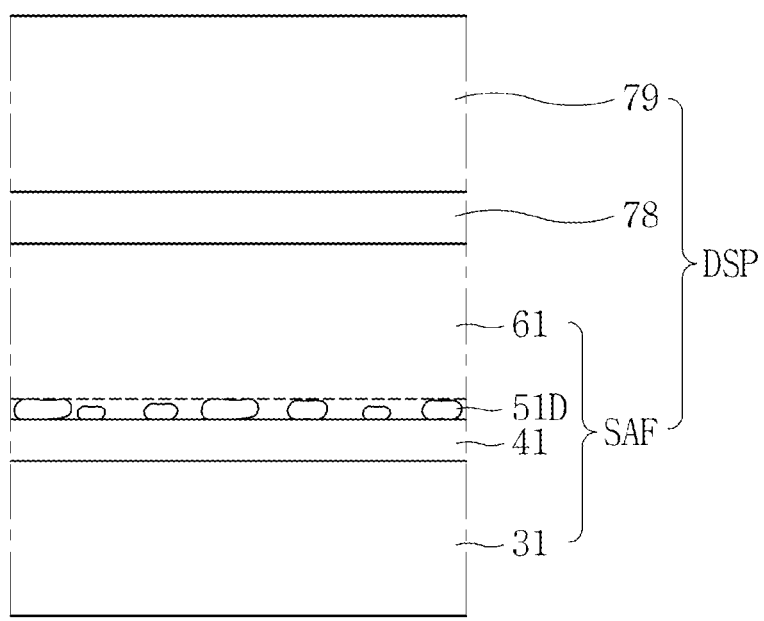

Referring to FIG. 7, a data storage element DSP may include a lower pinned layer 31, a spacer 41, a first non-magnetic junction layer 51D, an upper pinned layer 61, a tunnel barrier layer 78, and a free layer 79. The lower pinned layer 31, the spacer 41, the first non-magnetic junction layer 51D, and the upper pinned layer 61 may constitute an SAF pinned layer. The thickness of the first non-magnetic junction layer 51D may be 0.5 nm or less.

The first non-magnetic junction layer 51D may be a mixed layer of one or more materials selected from the group consisting of Ta, Rh, Ir, Cr, V, Re, Mo, W, Nb, and combinations thereof, and the upper pinned layer 61. For example, the first non-magnetic junction layer 51D may be formed of one or more materials selected from the group consisting of Ta, Rh, Ir, Cr, V, Re, Mo, W, Nb, and combinations thereof, and a material used to form the upper pinned layer 61, using a co-sputtering technique. In other embodiments, the first non-magnetic junction layer 51D may be formed by alternately depositing one or more materials selected from the group consisting of Ta, Rh, Ir, Cr, V, Re, Mo, W, Nb, and combinations thereof, and a material used to form the upper pinned layer 61. The first non-magnetic junction layer 51D may be formed with the upper pinned layer 61 using an in-situ process.

Figure 8:
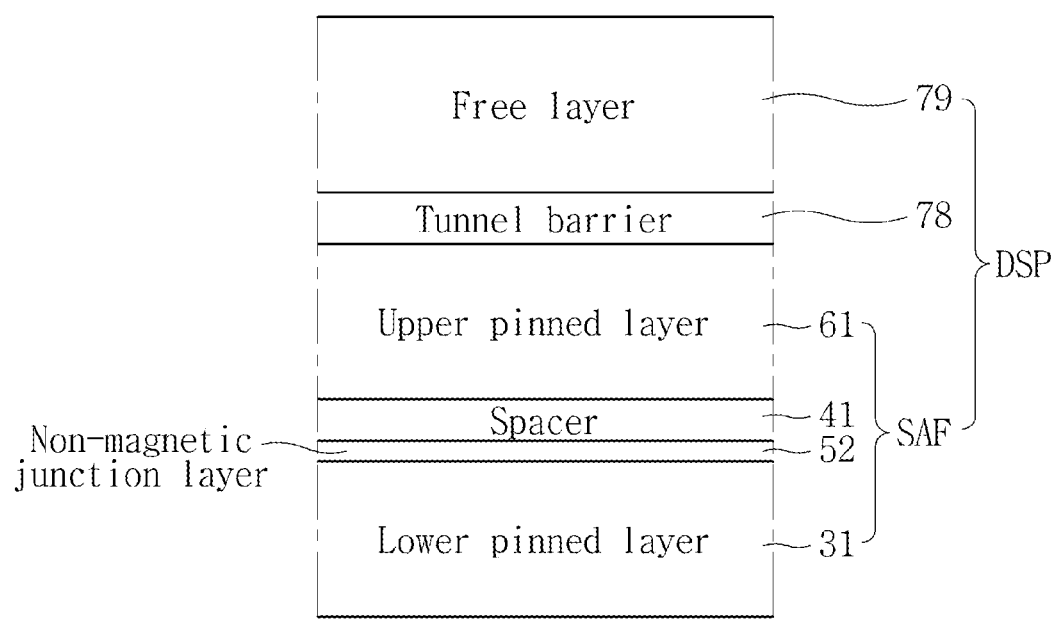

Referring to FIG. 8, a data storage element DSP may include a lower pinned layer 31, a second non-magnetic junction layer 52, a spacer 41, an upper pinned layer 61, a tunnel barrier layer 78, and a free layer 79. The lower pinned layer 31, the second non-magnetic junction layer 52, the spacer 41, and the upper pinned layer 61 may constitute an SAF pinned layer. The SAF pinned layer may be referred to as a "reference layer," and the free layer 79 may be referred to as a "storage layer."

The second non-magnetic junction layer 52 may be formed on the lower pinned layer 31. The second non-magnetic junction layer 52 may be formed between the lower pinned layer 31 and the spacer 41. The spacer 41 may be formed on the second non-magnetic junction layer 52. The second non-magnetic junction layer 52 may be in contact with the lower pinned layer 31 and the spacer 41. The upper pinned layer 61 may be formed on the spacer 41. The spacer 41 may be formed between the second non-magnetic junction layer 52 and the upper pinned layer 61.

The second non-magnetic junction layer 52 may be a non-magnetic metal junction layer. The second non-magnetic junction layer 52 may include a material having a lower diffusion coefficient than the spacer 41. For example, the second non-magnetic junction layer 52 may include a material having a lower diffusion coefficient than the spacer 41 at a high temperature, such as 300° C. or higher. The second non-magnetic junction layer 52 may include a material having high interlayer exchange coupling strength. For example, the second non-magnetic junction layer 52 may include a material having |Jex| greater than 0.1 erg/cm$^2$.

The second non-magnetic junction layer 52 may include Ta, Rh, Ir, Cr, V, Re, Mo, W, Nb, or a combination thereof. The second non-magnetic junction layer 52 may be a mixed layer of one or more materials selected from the group consisting of Ta, Rh, Ir, Cr, V, Re, Mo, W, Nb, and combinations thereof, and the spacer 41. The second non-magnetic junction layer 52 may be a mixed layer of one or more materials selected from the group consisting of Ta, Rh, Ir, Cr, V, Re, Mo, W, Nb, and combinations thereof, and the upper pinned layer 61. The second non-magnetic junction layer 52 may be a mixed layer of one or more materials selected from the group consisting of Ta, Rh, Ir, Cr, V, Re, Mo, W, Nb, and combinations thereof, and the lower pinned layer 31. The second non-magnetic junction layer 52 may be formed, for instance, using a PVD process, a CVD process, an ALD process, or a combination thereof.

Figure 9:
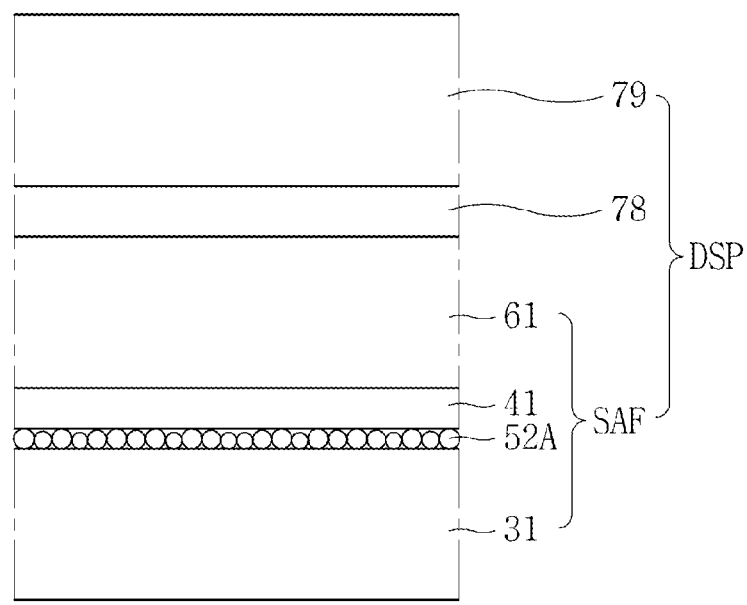

Referring to FIG. 9, a data storage element DSP may include a lower pinned layer 31, a second non-magnetic junction layer 52A, a spacer 41, an upper pinned layer 61, a tunnel barrier layer 78, and a free layer 79. The lower pinned layer 31, the second non-magnetic junction layer 52A, the spacer 41, and the upper pinned layer 61 may constitute an SAF pinned layer. The thickness of the second non-magnetic junction layer 52A may be 0.5 nm or less. The second non-magnetic junction layer 52A may be a single atomic layer. The second non-magnetic junction layer 52A may have a non-uniform thickness. The second non-magnetic junction layer 52A may include Ta, Rh, Ir, Cr, V, Re, Mo, W, Nb, or a combination thereof.

Figure 10:
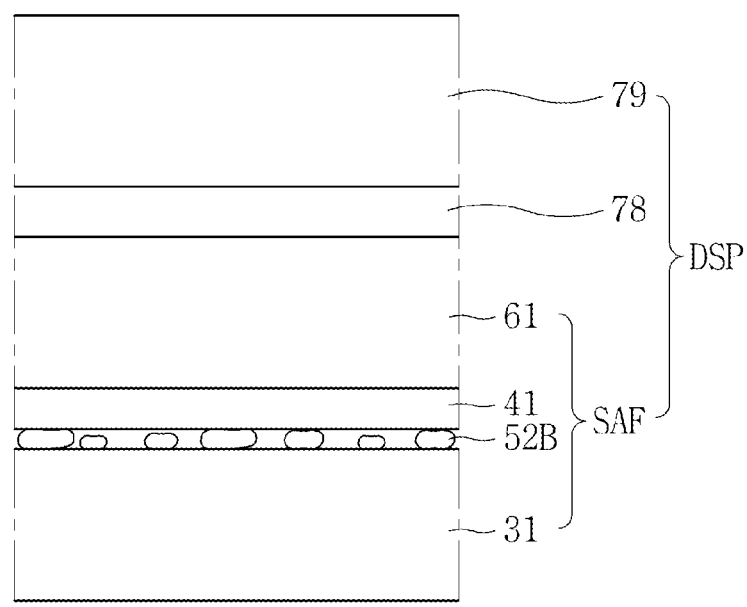

Referring to FIG. 10, a data storage element DSP may include a lower pinned layer 31, a second non-magnetic junction layer 52B, a spacer 41, an upper pinned layer 61, a tunnel barrier layer 78, and a free layer 79. The lower pinned layer 31, the second non-magnetic junction layer 52B, the spacer 41, and the upper pinned layer 61 may constitute an SAF pinned layer. The thickness of the second non-magnetic junction layer 52B may be 0.5 nm or less. The second non-magnetic junction layer 52B may have a discrete configuration. The second non-magnetic junction layer 52B may include Ta, Rh, Ir, Cr, V, Re, Mo, W, Nb, or a combination thereof.

In other embodiments, the second non-magnetic junction layer 52B may be retained between the lower pinned layer 31 and the spacer 41, and the spacer 41 may pass through the second non-magnetic junction layer 52B to be in contact with the lower pinned layer 31.

Figure 11:
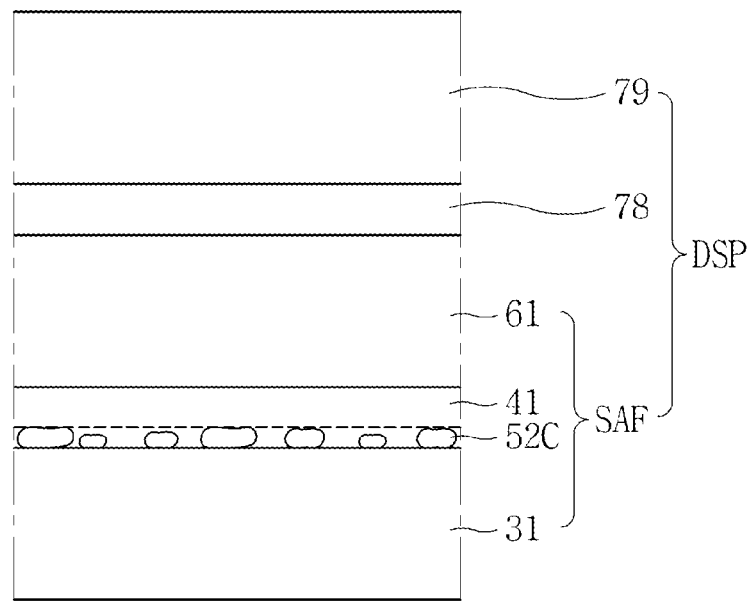

Referring to FIG. 11, a data storage element DSP may include a lower pinned layer 31, a second non-magnetic junction layer 52C, a spacer 41, an upper pinned layer 61, a tunnel barrier layer 78, and a free layer 79. The lower pinned layer 31, the second non-magnetic junction layer 52C, the spacer 41, and the upper pinned layer 61 may provide an SAF pinned layer. The thickness of the second non-magnetic junction layer 52C may be 0.5 nm or less.

The second non-magnetic junction layer 52C may be a mixed layer of one or more materials selected from the group consisting of Ta, Rh, Ir, Cr, V, Re, Mo, W, Nb, and combinations thereof, and the spacer 41. For example, the second non-magnetic junction layer 52C may be formed of one or more materials selected from the group consisting of Ta, Rh, Ir, Cr, V, Re, Mo, W, Nb, and combinations thereof, and a material used to form the spacer 41, using a co-sputtering technique. In other embodiments, the second non-magnetic junction layer 52C may be formed by alternately depositing one or more materials selected from the group consisting of Ta, Rh, Ir, Cr, V, Re, Mo, W, Nb, and combinations thereof, and a material used to form the spacer 41. The second non-magnetic junction layer 52C may be formed with the spacer 41 using an in-situ process.

Figure 12:
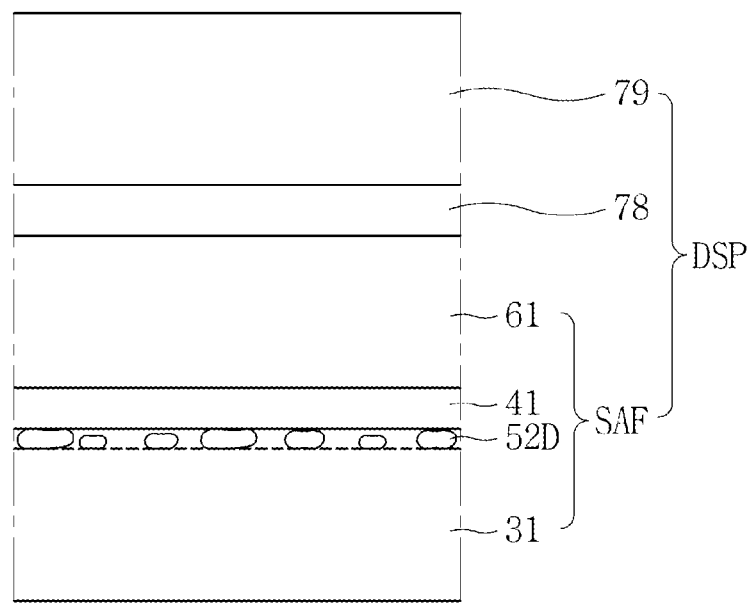

Referring to FIG. 12, a data storage element DSP may include a lower pinned layer 31, a second non-magnetic junction layer 52D, a spacer 41, an upper pinned layer 61, a tunnel barrier layer 78, and a free layer 79. The lower pinned layer 31, the second non-magnetic junction layer 52D, the spacer 41, and the upper pinned layer 61 may provide an SAF pinned layer. The thickness of the second non-magnetic junction layer 52D may be 0.5 nm or less.

The second non-magnetic junction layer 52D may be a mixed layer of one or more materials selected from the group consisting of Ta, Rh, Ir, Cr, V, Re, Mo, W, Nb, and combinations thereof, and the lower pinned layer 31. For example, the second non-magnetic junction layer 52D may be formed of one or more materials selected from the group consisting of Ta, Rh, Ir, Cr, V, Re, Mo, W, Nb, and combinations thereof, and a material used to form the lower pinned layer 31, using a co-sputtering technique. In other embodiments, the second non-magnetic junction layer 52D may be formed by alternately depositing one or more materials selected from the group consisting of Ta, Rh, Ir, Cr, V, Re, Mo, W, Nb, and combinations thereof, and a material used to form the lower pinned layer 31. The second non-magnetic junction layer 52D may be formed with the lower pinned layer 31 using an in-situ process.

Figure 13:
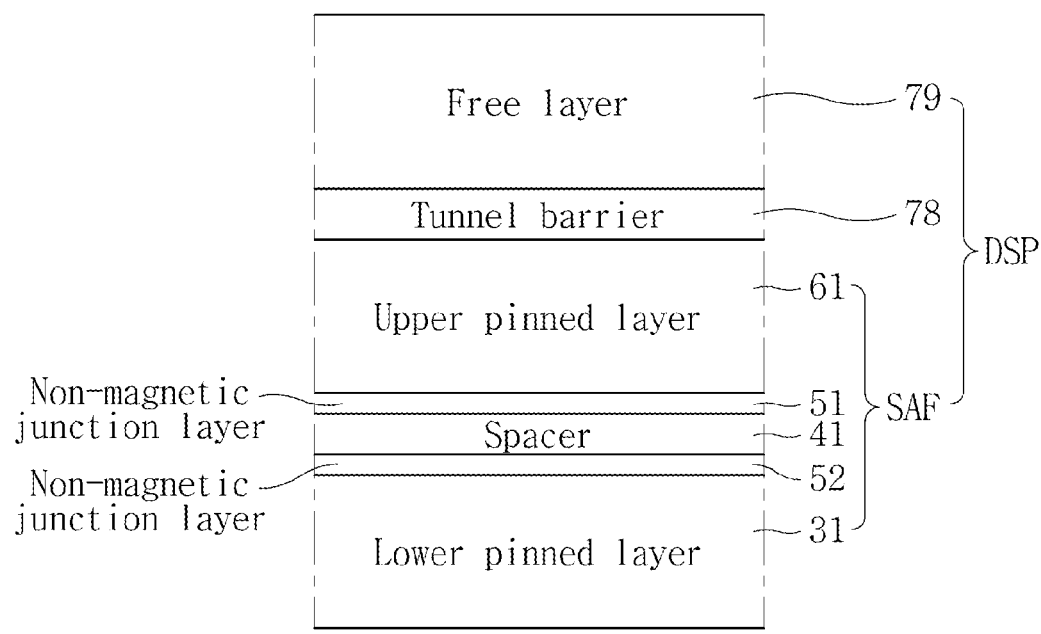

Referring to FIG. 13, a data storage element DSP may include a lower pinned layer 31, a second non-magnetic junction layer 52, a spacer 41, a first non-magnetic junction layer 51, an upper pinned layer 61, a tunnel barrier layer 78, and a free layer 79. The lower pinned layer 31, the second non-magnetic junction layer 52, the spacer 41, the first non-magnetic junction layer 51, and the upper pinned layer 61 may constitute an SAF pinned layer. The SAF pinned layer may be referred to as a "reference layer," and the free layer 79 may be referred to as a "storage layer."

The first non-magnetic junction layer 51 may be formed between the spacer 41 and the upper pinned layer 61, and the second non-magnetic junction layer 52 may be formed between the spacer 41 and the lower pinned layer 31. The first non-magnetic junction layer 51 may have any of the configurations as described previously with reference to FIGS. 3 to 7, and the second non-magnetic junction layer 52 may have any of the configurations as described previously with reference to FIGS. 8 to 12.

Figure 14:
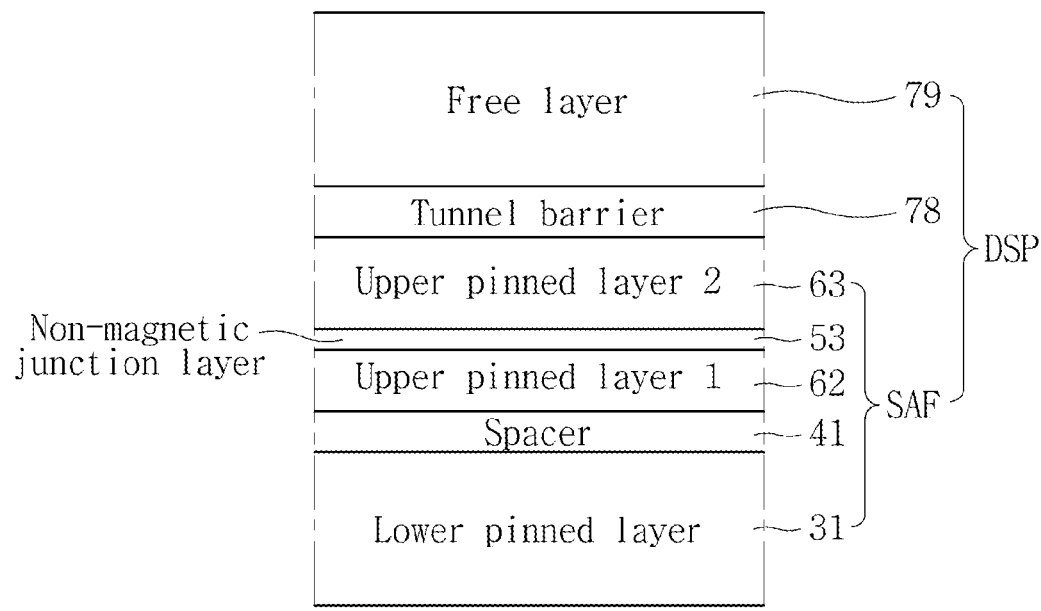

Referring to FIG. 14, a data storage element DSP may include a lower pinned layer 31, a spacer 41, a first upper pinned layer 62, a third non-magnetic junction layer 53, a second upper pinned layer 63, a tunnel barrier layer 78, and a free layer 79. The lower pinned layer 31, the spacer 41, the first upper pinned layer 62, the third non-magnetic junction layer 53, and the second upper pinned layer 63 may constitute an SAF pinned layer. The SAF pinned layer may be referred to as a "reference layer," and the free layer 79 may be referred to as a "storage layer."

The third non-magnetic junction layer 53 may be formed between the first upper pinned layer 62 and the second upper pinned layer 63. The first upper pinned layer 62 may have a smaller thickness than the second upper pinned layer 63. The first upper pinned layer 62 may be formed between the spacer 41 and the third non-magnetic junction layer 53.

The first upper pinned layer 62 may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof. The second upper pinned layer 63 may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof.

The third non-magnetic junction layer 53 may include a different material from the spacer 41. The third non-magnetic junction layer 53 may, for instance, be a non-magnetic metal junction layer. The third non-magnetic junction layer 53 may include a material having a lower diffusion coefficient than the spacer 41. For example, the third non-magnetic junction layer 53 may include a material having a lower diffusion coefficient than the spacer 41 at a high temperature, such as 300° C. or higher. The third non-magnetic junction layer 53 may include a material having high interlayer exchange coupling strength. For example, the third non-magnetic junction layer 53 may include a material having |Jex| greater than 0.1 erg/cm$^2$.

The third non-magnetic junction layer 53 may include Ta, Rh, Ir, Cr, V, Re, Mo, W, Nb, or a combination thereof. The third non-magnetic junction layer 53 may be a mixed layer of one or more materials selected from the group consisting of Ta, Rh, Ir, Cr, V, Re, Mo, W, Nb, and combinations thereof, and the spacer 41. The third non-magnetic junction layer 53 may be a mixed layer of one or more materials selected from the group consisting of Ta, Rh, Ir, Cr, V, Re, Mo, W, Nb, and combinations thereof, and the first upper pinned layer 62. The third non-magnetic junction layer 53 may be a mixed layer of one or more materials selected from the group consisting of Ta, Rh, Ir, Cr, V, Re, Mo, W, Nb, and combinations thereof, and the second upper pinned layer 63. The third non-magnetic junction layer 53 may be a mixed layer of one or more materials selected from the group consisting of Ta, Rh, Ir, Cr, V, Re, Mo, W, Nb, and combinations thereof, and the lower pinned layer 31. The third non-magnetic junction layer 53 may be formed using a PVD process, a CVD process, an ALD process, or a combination thereof.

Figure 15:
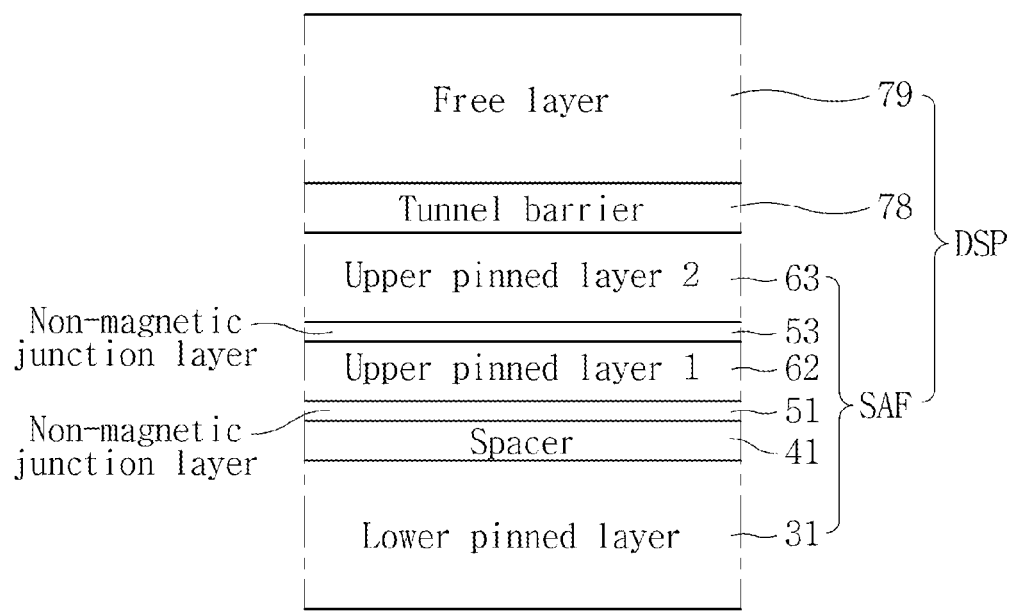

Referring to FIG. 15, a data storage element DSP may include a lower pinned layer 31, a spacer 41, a first non-magnetic junction layer 51, a first upper pinned layer 62, a third non-magnetic junction layer 53, a second upper pinned layer 63, a tunnel barrier layer 78, and a free layer 79. The lower pinned layer 31, the spacer 41, the first non-magnetic junction layer 51, the first upper pinned layer 62, the third non-magnetic junction layer 53, and the second upper pinned layer 63 may provide an SAF pinned layer. The SAF pinned layer may be referred to as a "reference layer," and the free layer 79 may be referred to as a "storage layer."

Figure 16:
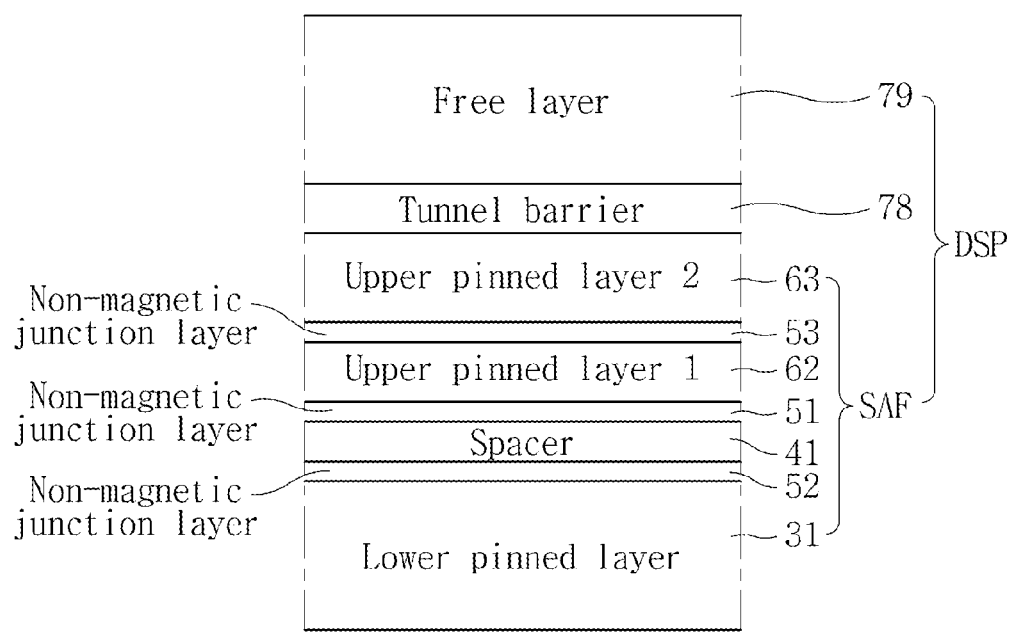

Referring to FIG. 16, a data storage element DSP may include a lower pinned layer 31, a second non-magnetic junction layer 52, a spacer 41, a first non-magnetic junction layer 51, a first upper pinned layer 62, a third non-magnetic junction layer 53, a second upper pinned layer 63, a tunnel barrier layer 78, and a free layer 79. The lower pinned layer 31, the second non-magnetic junction layer 52, the spacer 41, the first non-magnetic junction layer 51, the first upper pinned layer 62, the third non-magnetic junction layer 53, and the second upper pinned layer 63 may provide an SAF pinned layer. The SAF pinned layer may be referred to as a "reference layer," and the free layer 79 may be referred to as a "storage layer."

Figure 17:
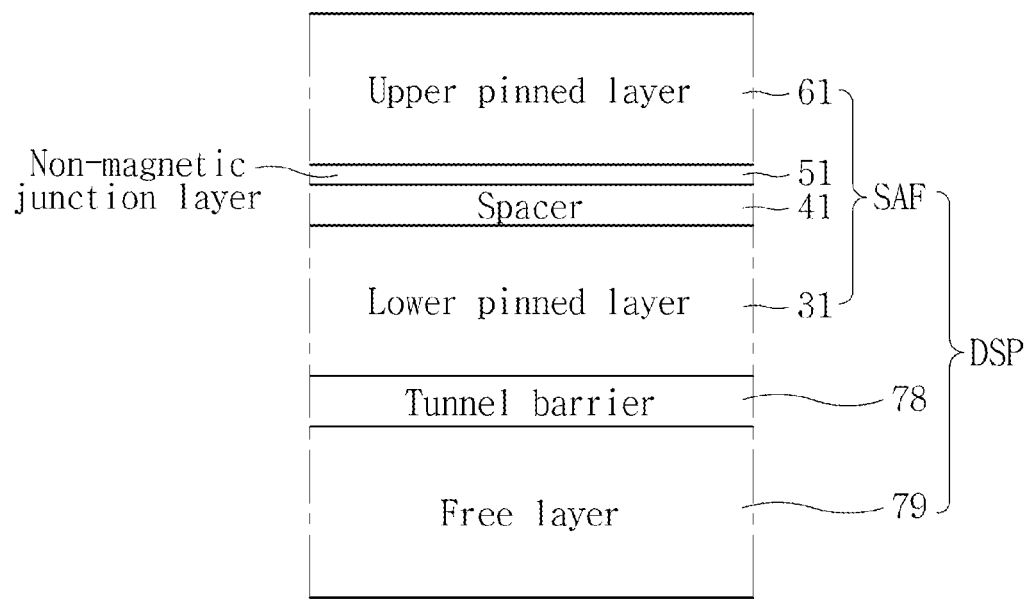

Referring to FIG. 17, a data storage element DSP may include a free layer 79, a tunnel barrier layer 78, a lower pinned layer 31, a spacer 41, a first non-magnetic junction layer 51, and an upper pinned layer 61. The lower pinned layer 31, the spacer 41, the first non-magnetic junction layer 51, and the upper pinned layer 61 may constitute an SAF pinned layer. The SAF pinned layer may be referred to as a "reference layer," and the free layer 79 may be referred to as a "storage layer."

The free layer 79 may be electrically connected to a drain of the switching device (SE in FIG. 2). The tunnel barrier layer 78 may be formed on the free layer 79. The lower pinned layer 31 may be formed on the tunnel barrier layer 78. The spacer 41 may be formed on the lower pinned layer 31. The upper pinned layer 61 may be formed on the spacer 41. The first non-magnetic junction layer 51 may be formed between the spacer 41 and the upper pinned layer 61. The upper pinned layer 61 may be connected to a selected one of the bitlines (BL in FIG. 2).

Figure 18:
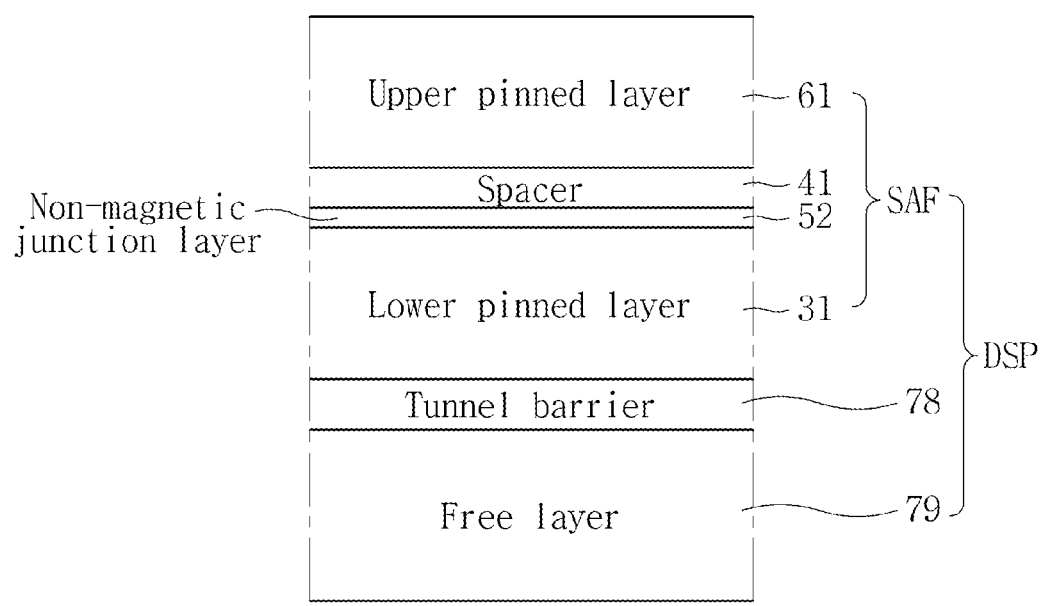

Referring to FIG. 18, a data storage element DSP may include a free layer 79, a tunnel barrier layer 78, a lower pinned layer 31, a second non-magnetic junction layer 52, a spacer 41, and an upper pinned layer 61. The lower pinned layer 31, the second non-magnetic junction layer 52, the spacer 41, and the upper pinned layer 61 may constitute an SAF pinned layer. The SAF pinned layer may be referred to as a "reference layer," and the free layer 79 may be referred to as a "storage layer." The second non-magnetic junction layer 52 may be formed between the lower pinned layer 31 and the spacer 41.

Figure 19:
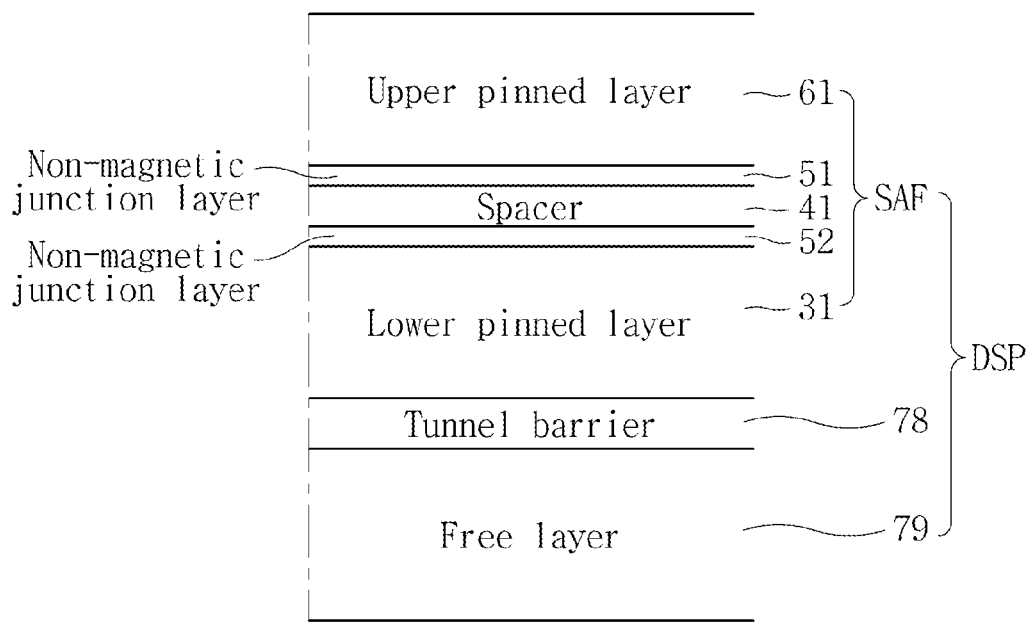

Referring to FIG. 19, a data storage element DSP may include a free layer 79, a tunnel barrier layer 78, a lower pinned layer 31, a second non-magnetic junction layer 52, a spacer 41, a first non-magnetic junction layer 51, and an upper pinned layer 61. The lower pinned layer 31, the second non-magnetic junction layer 52, the spacer 41, the first non-magnetic junction layer 51, and the upper pinned layer 61 may provide an SAF pinned layer. The SAF pinned layer may be referred to as a "reference layer," and the free layer 79 may be referred to as a "storage layer." The first non-magnetic junction layer 51 may be formed between the spacer 41 and the upper pinned layer 61. The second non-magnetic junction layer 52 may be formed between the lower pinned layer 31 and the spacer 41.

Figure 20:
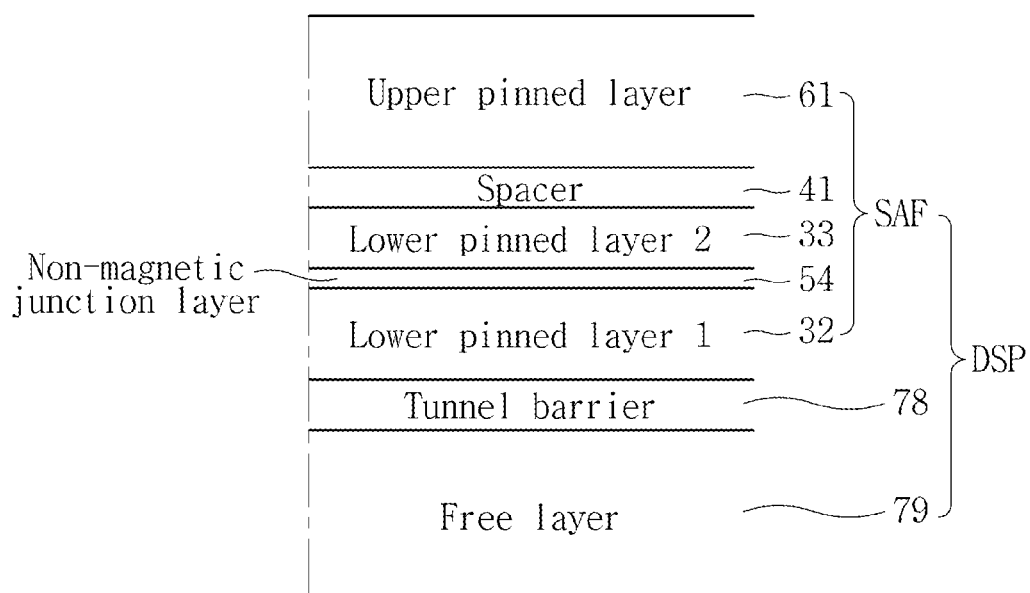

Referring to FIG. 20, a data storage element DSP may include a free layer 79, a tunnel barrier layer 78, a first lower pinned layer 32, a fourth non-magnetic junction layer 54, a second lower pinned layer 33, a spacer 41, and an upper pinned layer 61. The first lower pinned layer 32, the fourth non-magnetic junction layer 54, the second lower pinned layer 33, the spacer 41, and the upper pinned layer 61 may provide an SAF pinned layer. The SAF pinned layer may be referred to as a "reference layer," and the free layer 79 may be referred to as a "storage layer."

The first lower pinned layer 32 may be formed on the tunnel barrier layer 78. The second lower pinned layer 33 may be formed on the first lower pinned layer 32. The spacer 41 may be formed on the second lower pinned layer 33. The first lower pinned layer 32 may be thicker than the second lower pinned layer 33. The fourth non-magnetic junction layer 54 may be formed between the first lower pinned layer 32 and the second lower pinned layer 33. The first lower pinned layer 32 may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof. The second lower pinned layer 33 may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof.

Figure 21:
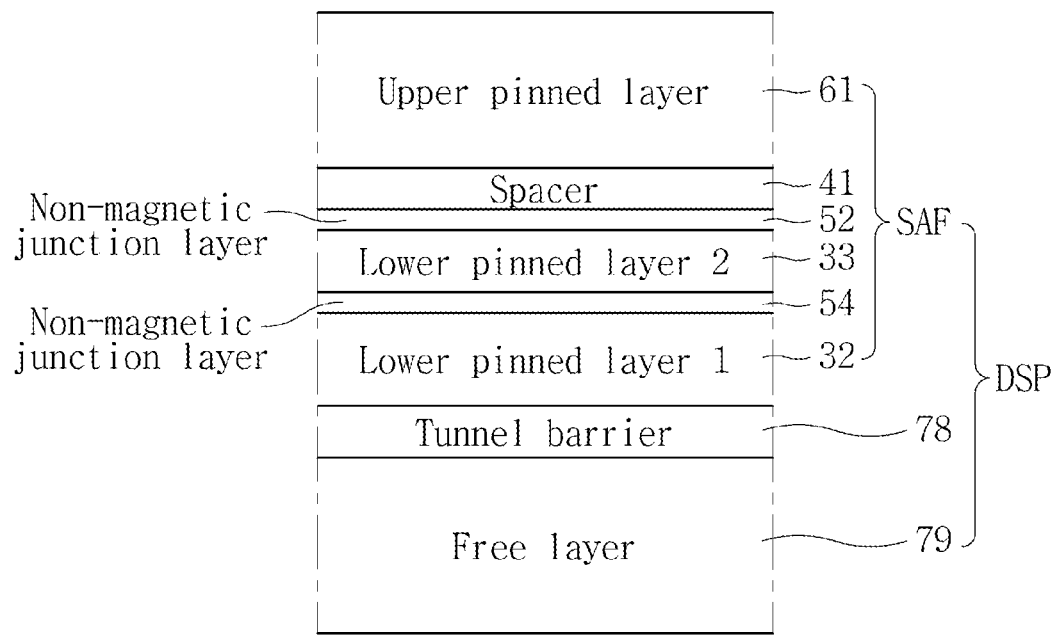
Figure 22:
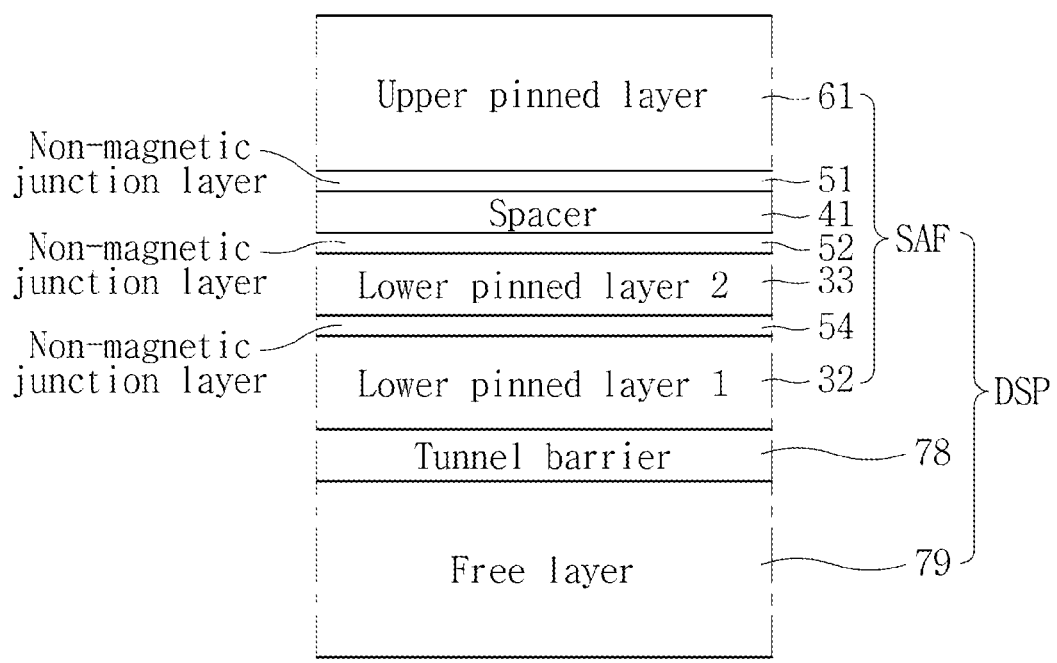

Referring to FIG. 21, a data storage element DSP may include a free layer 79, a tunnel barrier layer 78, a first lower pinned layer 32, a fourth non-magnetic junction layer 54, a second lower pinned layer 33, a second non-magnetic junction layer 52, a spacer 41, and an upper pinned layer 61. The first lower pinned layer 32, the fourth non-magnetic junction layer 54, the second lower pinned layer 33, the second non-magnetic junction layer 52, the spacer 41, and the upper pinned layer 61 may constitute an SAF pinned layer. The SAF pinned layer may be referred to as a "reference layer," and the free layer 79 may be referred to as a "storage layer."

Referring to FIG. 21, a data storage element DSP may include a free layer 79, a tunnel barrier layer 78, a first lower pinned layer 32, a fourth non-magnetic junction layer 54, a second lower pinned layer 33, a second non-magnetic junction layer 52, a spacer 41, a first non-magnetic junction layer 51, and an upper pinned layer 61. The first lower pinned layer 32, the fourth non-magnetic junction layer 54, the second lower pinned layer 33, the second non-magnetic junction layer 52, the spacer 41, the first non-magnetic junction layer 51, and the upper pinned layer 61 may constitute an SAF pinned layer. The SAF pinned layer may be referred to as a "reference layer," and the free layer 79 may be referred to as a "storage layer."

Figure 23:
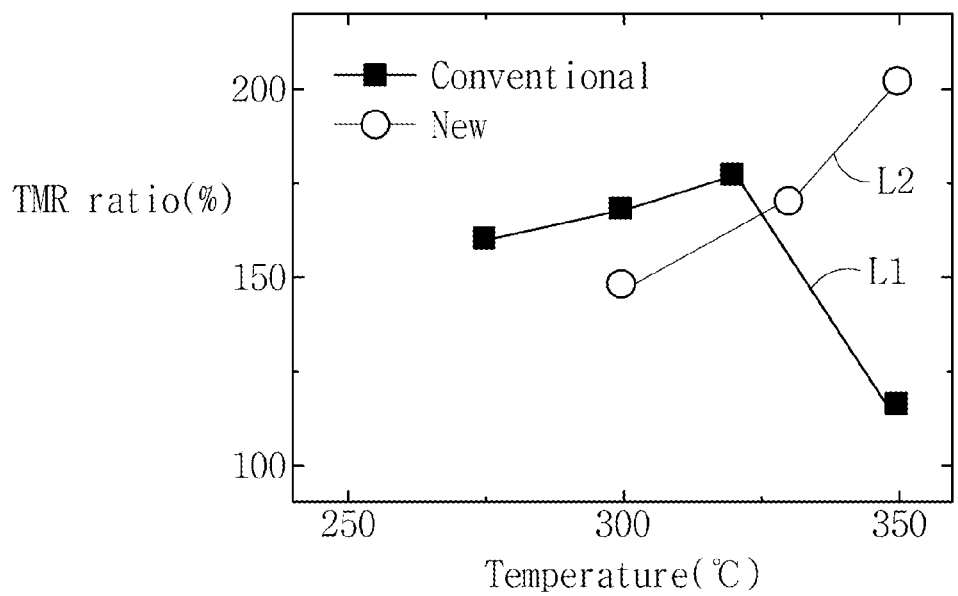
FIG. 23 is a graph showing magnetoresistance ratios according to annealing temperatures in a semiconductor device in accordance with embodiments of the inventive concepts.

FIG. 23 is a graph illustrating magnetoresistance ratios according to annealing temperatures in a semiconductor device constructed in accordance with embodiments of the inventive concepts. The horizontal axis in FIG. 23 represents the annealing temperature in ° C. The vertical axis in FIG. 23 represents the magnetoresistance ratio as a %.

Referring to FIG. 23, a first line L1 represents magnetoresistance ratios according to annealing temperatures when the first non-magnetic junction layer 51 is omitted from the data storage element DSP otherwise having a configuration as shown in FIG. 3. A second line L2 represents magnetoresistance ratios according to annealing temperatures in a data storage element DSP having the configuration shown FIG. 3. As shown by the second line L2, a high magnetoresistance ratio of 200% or more can be obtained using an annealing temperature of about 350° C. in the data storage element DSP that includes the first non-magnetic junction layer 51.

Figure 24:
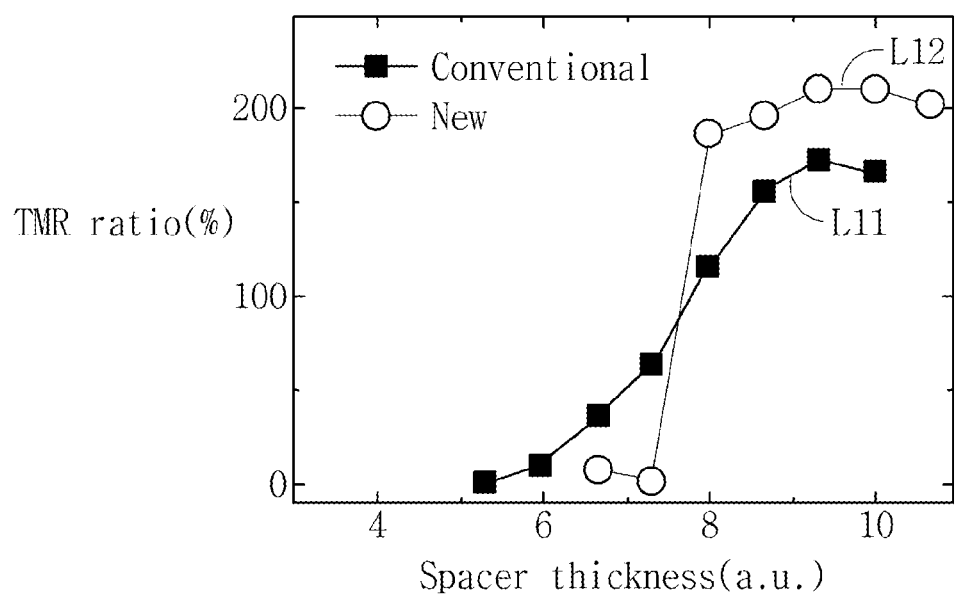
FIG. 24 is a graph showing magnetoresistance ratios according to thicknesses of a spacer in a semiconductor device in accordance with embodiments of the inventive concepts.

FIG. 24 is a graph illustrating variations in magnetoresistance ratios according to thicknesses of a spacer in a semiconductor device in accordance with embodiments of the inventive concepts. The horizontal axis in FIG. 24 represents the thickness of the spacer, and the unit of scale is an arbitrary unit (a.u.). The vertical axis in FIG. 24 represents the magnetoresistance ratio as a %.

Referring to FIG. 24, a first line L11 represents magnetoresistance ratios according to thicknesses of the spacer when the first non-magnetic junction layer 51 is omitted from a data storage element DSP otherwise having the configuration as shown in FIG. 3. A second line L12 represents magnetoresistance ratios according to thicknesses of the spacer in a data storage element DSP having a configuration as shown in FIG. 3. As represented by the second line L12, a high magnetoresistance ratio of 200% or more can be implemented using the data storage element DSP having the first non-magnetic junction layer 51.

Figure 25:
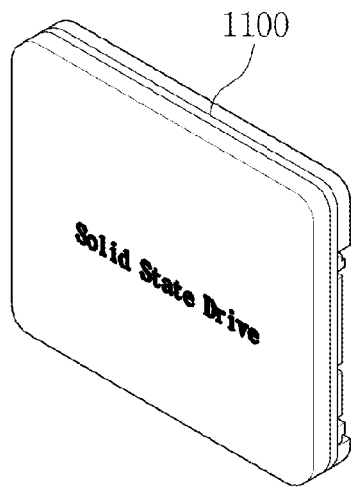
FIGS. 25 to 30 provide various somewhat schematic perspective views and schematic block diagrams of electronic apparatuses and systems in accordance with embodiments of the inventive concepts.
Figure 26:
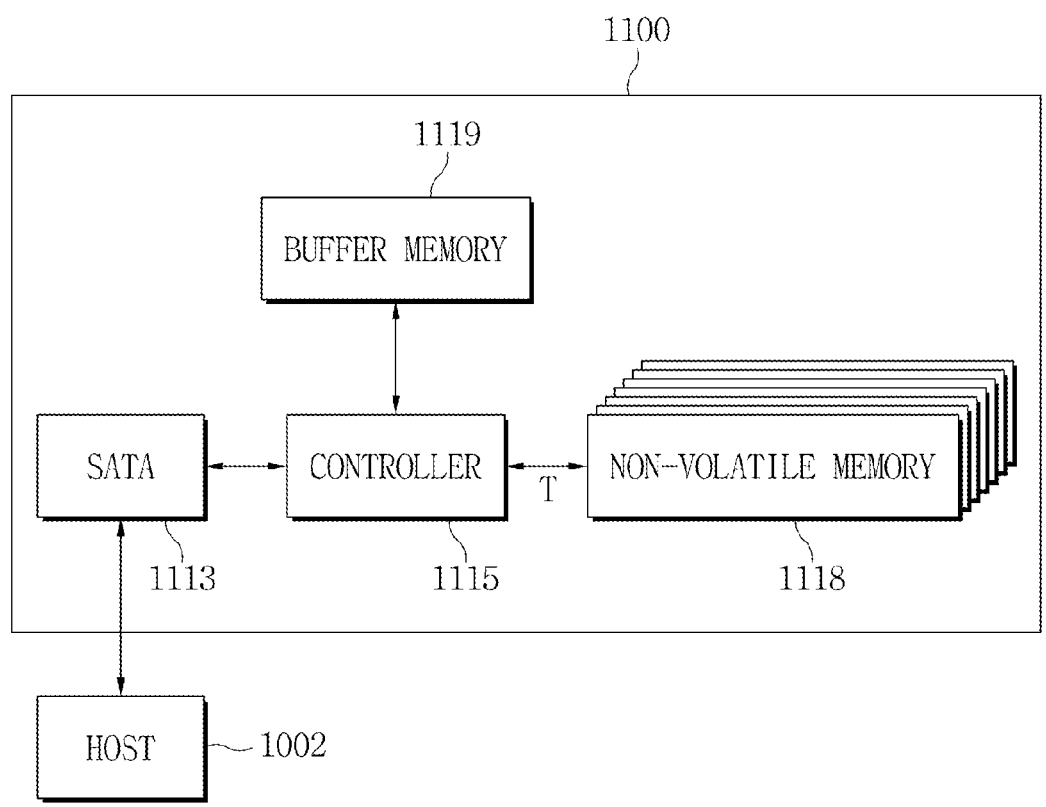

FIG. 25 is a somewhat schematic perspective view of an electronic apparatus constructed in accordance with embodiments of the inventive concepts. FIG. 26 is a schematic block diagram of an electronic system which may be used in the apparatus of FIG. 25. According to this embodiment, the electronic apparatus may be a data storage apparatus such as a solid state drive (SSD) 1100.

Referring to FIGS. 25 and 26, the SSD 1100 may include an interface 1113, a controller 1115, a non-volatile memory 1118, and a buffer memory 1119. The SSD 1100 may be an apparatus that stores information using a semiconductor device. The SSD 1100 is faster, has a lower mechanical delay or failure rate, and generates less heat and noise than a hard disk drive (HDD). Further, the SSD 1100 may be smaller and lighter than the HDD. The SSD 1100 may, for instance, be widely implemented in laptop computers, notebook PCs, desktop PCs, MP3 players, or portable storage apparatuses.

The controller 1115 may be formed close to the interface 1113 and may be electrically connected thereto. The controller 1115 may be a microprocessor including a memory controller and a buffer controller. The non-volatile memory 1118 may be formed close to the controller 1115 and may be electrically connected thereto. Data storage capacity of the SSD 1100 may correspond to the capacity of the non-volatile memory 1118. The buffer memory 1119 may be formed close to the controller 1115 and may be electrically connected thereto.

The interface 1113 may be connected to a host 1002, and may send and receive electrical signals, such as data. For example, the interface 1113 may be a device using a standard such as a Serial Advanced Technology Attachment (SATA), an Integrated Drive Electronics (IDE), a Small Computer System Interface (SCSI), and/or a combination thereof. The non-volatile memory 1118 may be connected to the interface 1113 via the controller 1115. The non-volatile memory 1118 may function to store data received through the interface 1113. Even when power supplied to the SSD 1100 is interrupted, the data stored in the non-volatile memory 1118 may be retained.

The buffer memory 1119 may include a volatile memory. The volatile memory may be a dynamic random access memory (DRAM) and/or a static random access memory (SRAM). The buffer memory 1119 may have a relatively faster operating speed than the non-volatile memory 1118.

A data processing speed of the interface 1113 may be relatively faster than the operating speed of the non-volatile memory 1118. Here, the buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Further, frequently-used items of data stored in the non-volatile memory 1118 may be pre-read and temporarily stored in the buffer memory 1119. That is, the buffer memory 1119 may function to increase an effective operating speed of the SSD 1100, and to reduce error rate.

The non-volatile memory 1118 may have any of the configurations as described previously with reference to FIGS. 1 to 22. For example, the buffer memory 1119 may include the contact plug (reference numeral 65 in FIG. 26).

Figure 27:
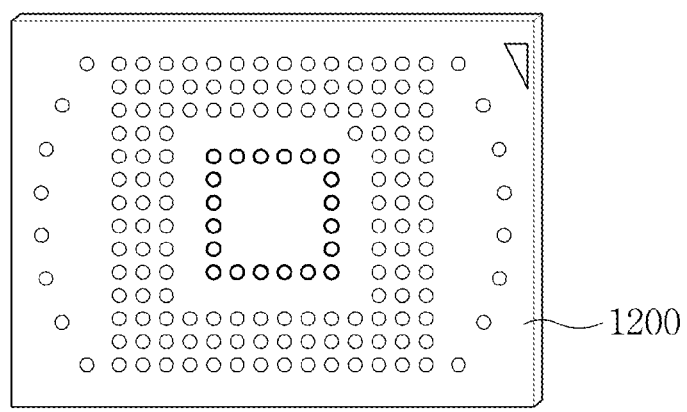
Figure 28:
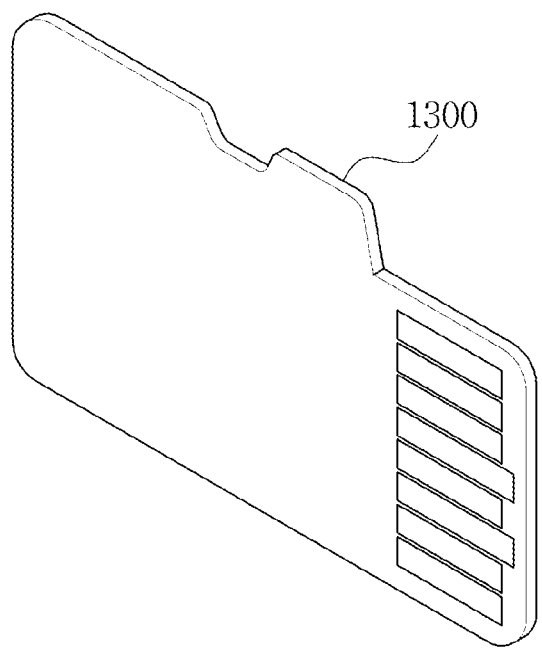
Figure 29:
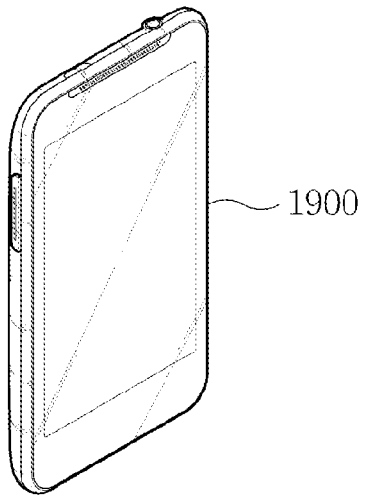
Figure 30:
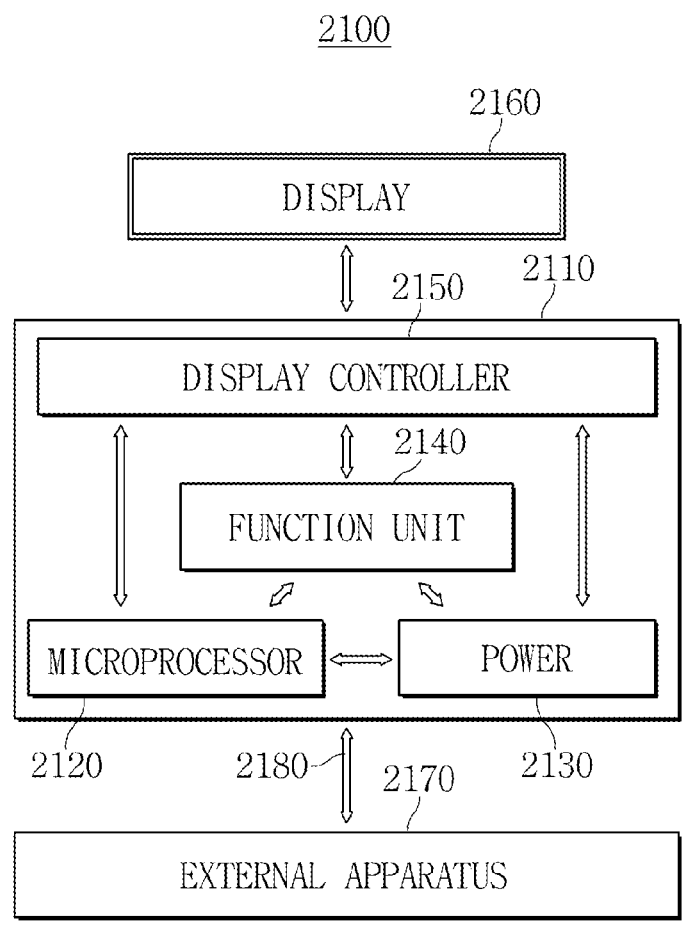

FIGS. 27 to 29 are somewhat schematic perspective views of electronic apparatuses constructed in accordance with embodiments of the inventive concepts, and FIG. 30 is a schematic block diagram of an electronic system that may be implemented in accordance with embodiments of the inventive concepts.

Referring to FIGS. 27 to 29, any of the semiconductor device configurations described previously with reference to FIGS. 1 to 22 may be usefully applied to an electronic system, such as an embedded multi-media chip (eMMC) 1200, a micro SD 1300, a smart phone 1900, a netbook, a laptop computer, or a tablet PC. For example, a semiconductor device (such as described with reference to FIGS. 1 to 22) may be installed in a mainboard of the smart phone 1900. The semiconductor device may be provided in an expansion apparatus, such as the micro SD 1300, to be used combined with the smart phone 1900.

Referring to FIG. 30, any of the semiconductor device configurations as described previously with reference to FIGS. 1 to 22, may be implemented in an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be installed on the body 2110. A display unit 2160 may be disposed on the inside or outside of the body 2110. For example, the display unit 2160 may be disposed on a surface of the body 2110 and display an image processed by the display controller unit 2150.

The power unit 2130 may receive a constant voltage from an external battery (not shown), etc., divide the voltage into various levels of voltages, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a smart phone, the function unit 2140 may have several components which perform functions of a mobile phone, such as output of an image to the display unit 2160 or output sound to a speaker, or dialing or communication with an external apparatus 2170. If a camera is installed, the function unit 2140 may function as a camera image processor.

In this embodiment incorporating the inventive concepts, when the electronic system 2100 is connected to a memory card, etc., in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc., in order to expand functionality, the function unit 2140 may function as an interface controller. The function unit 2140 may include a mass storage apparatus.

A semiconductor device, as described with reference to FIGS. 1 to 22, may be implemented, for instance, as part of the function unit 2140 or the microprocessor unit 2120. For example, the function unit 2140 may include the data storage element (DSP in FIG. 3). The data storage element (DSP in FIG. 3) may be electrically connected to the body 2110.

According to embodiments of the inventive concepts, an SAF pinned layer having a spacer and non-magnetic junction layer may be provided. A tunnel bather layer may be interposed between a free layer and the SAF pinned layer. The SAF pinned layer may function as a barrier that prevents diffusion of materials included in the spacer to other layers or interface areas nearby. A magnetic device having a high magnetoresistance ratio may thereby be implemented.

The foregoing illustrative embodiments are not to be construed as limiting the inventive principles herein. Although a few embodiments have been described, those skilled in the art will readily appreciate that many modifications are possible without materially departing from the novel teachings and advantages disclosed herein. Accordingly, all such modifications are intended to be included within the scope of the inventive concepts as defined in the claims. In the claims, means-plus-function clauses are intended to cover the structures described herein as performing the recited function, and not only structural equivalents but also equivalent structures.

What is claimed is:

1. A semiconductor device, comprising:
a free layer;
a pinned layer spaced apart from the free layer; and
a tunnel barrier layer disposed between the free layer and the pinned layer,
wherein the pinned layer comprises:
a lower pinned layer;
an upper pinned layer spaced apart from the lower pinned layer;
a spacer disposed between the lower pinned layer and the upper pinned layer; and
a non-magnetic junction layer disposed between at least one of the lower and upper pinned layers and the spacer.

2. The semiconductor device of claim 1, wherein the non-magnetic junction layer is a non-magnetic metal junction layer.

3. The semiconductor device of claim 1, wherein the non-magnetic junction layer includes a material having a lower diffusion coefficient than the spacer.

4. The semiconductor device of claim 1, wherein the non-magnetic junction layer includes a material having an interlayer exchange coupling strength |Jex| greater than 0.1 erg/cm$^2$.

5. The semiconductor device of claim 1 wherein the non-magnetic junction layer includes Ta, Rh, Ir, Cr, V, Re, Mo, W, Nb, or a combination thereof.

6. The semiconductor device of claim 1, wherein the thickness of the non-magnetic junction layer is smaller than a thickness of the spacer.

7. The semiconductor device of claim 6, wherein the thickness of the spacer is 1 nm or less, and wherein the thickness of the non-magnetic junction layer is 0.5 nm or less.

8. A semiconductor device, comprising:
a free layer;
a pinned layer spaced apart from the free layer; and
a tunnel barrier layer disposed between the free layer and the pinned layer,
wherein the pinned layer comprises:
a lower pinned layer;
an upper pinned layer spaced apart from the lower pinned layer;
a spacer disposed between the lower pinned layer and the upper pinned layer; and
a non-magnetic junction layer disposed adjacent to the spacer,
wherein the thickness of the non-magnetic junction layer is smaller than a thickness of the spacer.

9. The semiconductor device of claim 8, wherein the thickness of the spacer is about 1 nm or less, and wherein the thickness of the non-magnetic junction layer is about 0.5 nm or less.

10. The semiconductor device of claim 8, wherein the non-magnetic junction layer is a non-magnetic metal junction layer.

11. The semiconductor device of claim 8, wherein the non-magnetic junction layer includes a material having a lower diffusion coefficient than the spacer.

12. The semiconductor device of claim 8, wherein the non-magnetic junction layer includes a material having an interlayer exchange coupling strength |Jex| greater than about 0.1 erg/cm$^2$.

13. The semiconductor device of claim 8 wherein the non-magnetic junction layer includes Ta, Rh, Ir, Cr, V, Re, Mo, W, Nb, or a combination thereof.

14. The semiconductor device of claim 8, wherein the non-magnetic junction layer is a first non-magnetic junction layer, said device further comprising a second non-magnetic junction layer arranged on an opposite side of the spacer as the first non-magnetic junction layer.

15. The semiconductor device of claim 1, wherein the non-magnetic junction layer is a first non-magnetic junction layer, said device further comprising a second non-magnetic junction layer arranged on an opposite side of the spacer as the first non-magnetic junction layer.

16. A semiconductor device, comprising:
a free layer;
a pinned layer spaced apart from the free layer; and
a tunnel barrier layer disposed between the free layer and the pinned layer,
wherein the pinned layer comprises:
a lower pinned layer;
an upper pinned layer spaced apart from the lower pinned layer;
a spacer disposed between the lower pinned layer and the upper pinned layer;
a first non-magnetic junction layer disposed adjacent to one side of the spacer; and
a second non-magnetic junction layer disposed adjacent to an opposite side of the spacer as the first non-magnetic junction layer.

17. The semiconductor device of claim 16, wherein the thickness of the first non-magnetic junction layer is smaller than a thickness of the spacer.

18. The semiconductor device of claim 17, wherein the thickness of the spacer is about 1 nm or less, and wherein the thickness of the first non-magnetic junction layer is about 0.5 nm or less.

19. The semiconductor device of claim 16, wherein each of the non-magnetic junction layers is a non-magnetic metal junction layer.

20. The semiconductor device of claim 16, wherein each of the non-magnetic junction layers includes a material having a lower diffusion coefficient than the spacer.

* * * * *